(12) United States Patent
Jung et al.

(10) Patent No.: US 6,593,446 B1
(45) Date of Patent: Jul. 15, 2003

(54) ORGANIC POLYMER FOR ORGANIC ANTI-REFLECTIVE COATING LAYER AND PREPARATION THEREOF

(75) Inventors: Jae-Chang Jung, Gyunggi-do (KR); Keun-Kyu Kong, Kwangju-shi (KR); Min-Ho Jung, Gyunggi-do (KR); Sung-Eun Hong, Gyunggi-do (KR); Geun-Su Lee, Gyunggi-do (KR); Ki-Ho Baik, Gyunggi-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 25 days.

(21) Appl. No.: 09/657,069

(22) Filed: Sep. 7, 2000

(30) Foreign Application Priority Data

Sep. 7, 1999 (KR) ......................................... 1999-37876

(51) Int. Cl.⁷ ............................. C08G 6/00; C03F 7/40
(52) U.S. Cl. ..................... 528/230; 526/219.6; 526/315; 430/296; 430/313; 430/317; 430/18; 438/735
(58) Field of Search ................. 526/219.6, 315; 430/296, 313, 317, 18; 438/735; 528/230

(56) References Cited

U.S. PATENT DOCUMENTS

| | | | |
|---|---|---|---|
| 3,919,451 A | * 11/1975 | Levy et al. .................. | 427/369 |
| 4,424,270 A | 1/1984 | Erdmann et al. ........... | 430/166 |
| 4,822,718 A | 4/1989 | Latham et al. ............... | 430/271 |
| 5,674,648 A | 10/1997 | Brewer et al. ................ | 430/18 |
| 6,319,654 B1 | * 11/2001 | Kim et al. ................... | 430/296 |

FOREIGN PATENT DOCUMENTS

| | | |
|---|---|---|
| EP | 0 277 038 A2 | 1/1988 |
| WO | WO00/01752 | 1/2000 |

OTHER PUBLICATIONS

Elias et al In the Journal "Macromolecular Chemistary", 1968, 113, 155–70.*

* cited by examiner

*Primary Examiner*—Tatyana Zalukaeva
(74) *Attorney, Agent, or Firm*—Townsend and Townsend and Crew LLP

(57) ABSTRACT

The present invention provides an organic anti-reflective film composition suitable for use in submicrolithography. The composition comprises a compound of chemical formula 11 and a compound of chemical formula 12. The organic anti-reflective film effectively absorbs the light penetrating through the photoresist film coated on top of the anti-reflective film, thereby greatly reducing the standing wave effect. Use of organic anti-reflective films of the present invention allows patterns to be formed in a well-defined, ultrafine configuration, providing a great contribution to the high integration of semiconductor devices.

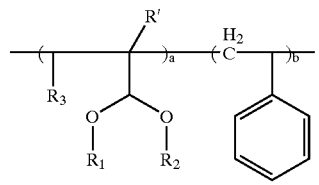

Formula 11

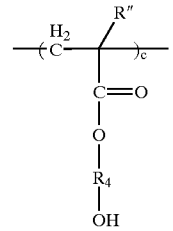

Formula 12 wherein a, b, c, R', R'', $R_1$, $R_2$, $R_3$, and $R_4$ are those defined herein.

18 Claims, 1 Drawing Sheet

140nm

ORGANIC POLYMER FOR ORGANIC ANTI-REFLECTIVE COATING LAYER AND PREPARATION THEREOF

BACKGROUND OF THE INVENTION

1. Field of the Invention

The present invention relates to an organic anti-reflective film composition suitable for use in submicrolithography. More particularly, the present invention relates to an organic anti-reflective film composition which contains a chromophore with high absorbance at the wavelengths useful for submicrolithography, thereby allowing stable formation of ultrafine patterns suitable for use in the high integration of semiconductor devices. Also, the present invention is directed to a method for forming ultrafine patterns using such an organic anti-reflective film composition.

2. Description of the Prior Art

In a submicrolithographic process, there inevitably occurs standing waves and reflective notching of the waves due to the optical properties of lower layers coated on the wafer, due to changes in the thickness of the photoresist film applied thereon, and due to the CD (critical dimension) alteration caused by diffracted and reflected light from the lower layers. As a solution to these problems, it has been proposed to introduce into the lower part of the photoresist film an anti-reflective layer made of a material which is highly absorptive of the light whose wavelength ranges are used in the submicrolithography process.

In the absence of such an anti-reflective layer, the light, when being irradiated on the photoresist film from a UV light source, penetrates into the photoresist film and is reflected back or scattered from its lower layer or the surface of the semiconductor chip. The anti-reflective layer can be introduced to prevent the reflection or scattering of light, thereby having a direct influence on the submicrolithography process of photoresist films.

The anti-reflective film can be inorganic or organic material and is generally divided into two types depending on its mechanism: an absorptive anti-reflective film or an interferential anti-reflective film.

For the microlithography using i-line (365 nm) as a light source, inorganic anti-reflective films are usually used. Of these, absorptive anti-reflective layers are largely made from TiN or amorphous carbon (amorphous-C) while interferential anti-reflective layers are mostly based on SiON. These SiON-based anti-reflective films are also used for the formation of ultrafine patterns for which KrF (248 nm) is utilized as a light source.

As for an ArF light source, which is much shorter in wavelength than the above-mentioned two light sources, a suitable anti-reflective films pertinent to submicrolithography has not yet been developed. Currently, there is an extensive research directed to the development of organic anti-reflective materials which are suitable for use in an ArF light submicrolithography process.

Following are desired characteristics for organic anti-reflective materials:

First, peeling of the photoresist layer due to dissolution of the organic anti-reflective material in a solvent should not take place when conducting a lithographic process. In this regard, organic anti-reflective materials should be designed so that their cured films have a crosslinked structure without producing by-products.

Second, there should be no migration of chemical materials, such as acids or amines, to and from the anti-reflective layers. If acids migrate from the anti-reflective layer into an unexposed area of a positive photoresist film, the photosensitive patterns are undercut while the egress of bases, such as amines, causes a footing phenomena.

Third, faster etch rates should be realized in the anti-reflective layer than in the upper photosensitive film, allowing an etching process to be conducted smoothly with the photosensitive film serving as a mask.

Finally, organic anti-reflective layers should be as thin as possible while having a superior ability to prevent light reflection.

SUMMARY OF THE INVENTION

The present invention provides an anti-reflective resin which meets the above requirements. In particular, it has been found that anti-reflective resins of the present invention are suitable for use in ultrafine pattern formation using ArF light source.

Another embodiment of the present invention provides a method for preparing an organic compound which reduces or prevents the diffusion and reflection of light in a submicrolithography process.

Yet another embodiment of the present invention provides an anti-reflective composition containing such an organic diffusion/reflection-preventive compound and a method for preparing the same.

Still another embodiment of the present invention provides a method for forming a pattern with a greatly reduced standing wave effect on a semiconductor device using an ArF laser submicrolithography process.

Still yet another embodiment of the present invention provides a semiconductor device on which a pattern is formed from such an anti-reflective composition by submicrolithography.

DETAILED DESCRIPTION OF THE INVENTION

Figure 1:
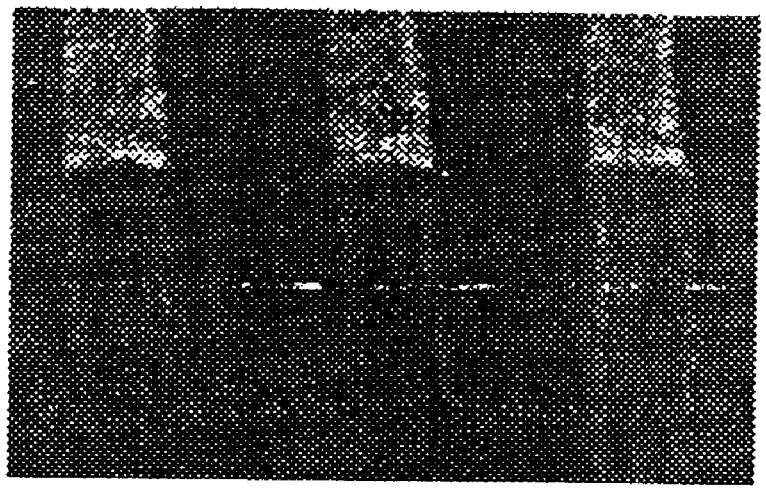
FIG. 1 is a photograph showing well-defined perpendicular patterns formed on an organic anti-reflective film composition of the present invention.

The present invention provides an organic anti-reflective composition comprising a compound of chemical formula 11, a compound of chemical formula 12, a heat acid generator and an organic solvent:

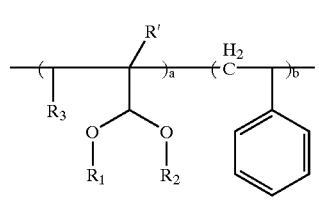

Formula 11

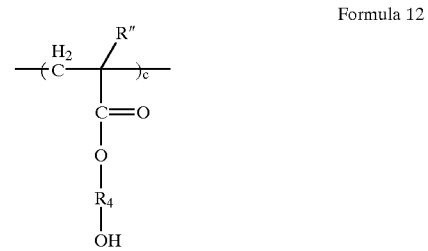

Formula 12 wherein
  a, b and c are mole numbers, provided that the ratio of a:b ranges from 0.1–1.0:0.1–1.0 and c is 1;
  R' and R" are independently hydrogen or alkyl, preferably a methyl group;
  $R_1$, $R_2$ and $R_4$, which are the same or different, each represents a substituted or unsubstituted, linear or branched alkyl group containing 1–5 carbon atoms; and $R_3$ is a hydrogen atom or a substituted or unsubstituted, linear or branched alkyl group containing 1–5 carbon atoms.

Preferably, the organic solvent is selected from the group consisting of methyl 3-methoxypropionate, ethyl 3-ethoxypropionate, propyleneglycol methyletheracetate, 2-heptanone, tetrahydrofuran and mixtures thereof. Preferably, the organic solvent is used in an amount from about 2,000 to about 4,000% by weight based on the weight of the compound of the chemical formula 11 or 12.

In aspect of the present invention, the heat acid-generator is preferably used in an amount from about 0.1 to about 10% by weight of the total weight of the compounds of the chemical formulas 11 and 12. Preferably, the heat acid-generator is selected from the group consisting of compounds of chemical formulas 7 to 10:

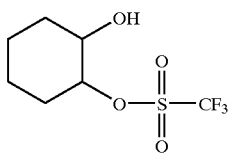

Formula 7

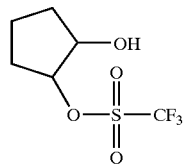

Formula 8

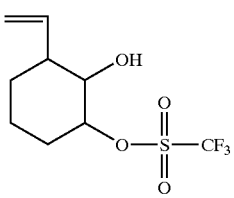

Formula 9

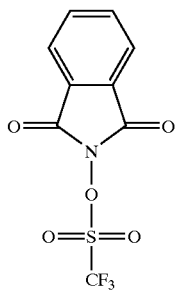

Formula 10

Preferably, the molecular weight of a compound of chemical formula 11 is from about 4,000 to about 12,000.

Another embodiment of the present invention provides a method for preparing compounds of chemical formula 11 by dissolving appropriate monomers of chemical formula 11 and a polymerization initiator in an organic solvent and providing conditions sufficient to produce compounds of chemical formula 11. The polymerization is generally conducted under an inert atmosphere, preferably in a nitrogen or an argon atmosphere.

Preferably, compounds of chemical formula 11 is prepared using monomers of chemical formulas 1 and 2:

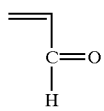

Formula 1

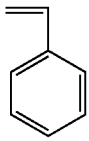

Formula 2

Preferably, the solvent for polymerization is selected from the group consisting of tetrahydrofuran, toluene, benzene, methylethyl ketone, dioxane and mixtures thereof.

Preferably, the polymerization initiator is selected from the group consisting of 2,2-azobisisobutyronitrile (AIBN), benzoylperoxide, acetylperoxide, laurylperoxide, t-butyloxide and mixtures thereof.

Another embodiment of the present invention provides a method for forming an anti-reflective film pattern using the above described organic anti-reflective film composition comprising the steps of:

(a) coating the above described organic anti-reflective film composition onto a layer to be etched;

(b) baking the organic anti-reflective film composition-coated layer;

(c) creating a photoresist pattern by coating a photoresist film on the organic anti-reflective film;

(d) exposing the photoresist film to a light source;

(e) developing the light-exposed photoresist film; and (f) etching sequentially the organic anti-reflective film and the layer to be etched, with the photoresist pattern serving as an etch mask.

In one embodiment, the baking step is preferably conducted at 100–250° C. for 1–5 min.

The method for forming an anti-reflective film pattern can further comprise a baking step prior to and/or subsequent to the exposing step. In this case, the baking step is preferably conducted at 70–200° C.

Preferably, the light source is selected from the group consisting of deep ultra violet beams including ArF, KrF and EUV, an electron beam, an X-ray, an ion beam, and combinations thereof. Preferably, the exposing step is carried out with the light energy of 0.1–20 mJ/cm$^2$.

In accordance with still another embodiment of the present invention, there is provided a semiconductor device which is fabricated using the anti-reflective film pattern prepared above.

A better understanding of the present invention may be obtained in light of the following examples which are set forth to illustrate, but are not to be construed to limit, the present invention.

EXAMPLE 1

Synthesis of Compound of Chemical Formula 3

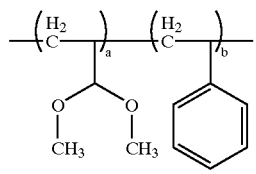

Formula 3

In a 250 ml round-bottom flask, 0.2 moles (11.2 g) of a monomer of chemical formula 1 and 0.2 moles (20.8 g) of a monomer of chemical formula 2 were dissolved in 66 g of tetrahydrofuran. The resulting solution was heated to 65° C. for six hours in the presence of 0.64 g of 2,2-azobisisobutyronitrile (AIBN) under an inert atmosphere such as nitrogen or argon. The product was precipitated in ethyl ether and dried to afford an intermediate compound (12.8 g: Yield 40%).

In a 500 ml round-bottom flask was placed the intermediate compound along with 300 g of methanol and 0.08 ml of trifluoromethanesulfonic acid. The reaction mixture was stirred at 85° C. for ten hours. Thereafter, the solution was neutralized to about pH 7 with tetramethylammonium hydroxide. The reaction mixture was concentrated and the residue was precipitated in water to afford compound of chemical formula 3 (10.24 g; Yield 80%).

EXAMPLE 2

Synthesis of Compound of Chemical Formula 4

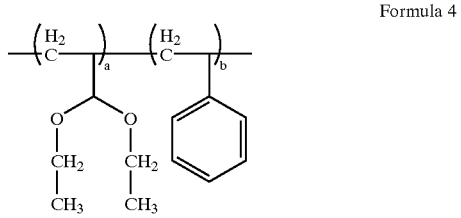

Formula 4

In a 250 ml round-bottom flask, 0.2 moles (11.2 g) of a monomer of chemical formula 1 and 0.2 moles (20.8 g) of a monomer of chemical formula 2 were dissolved in 66 g of tetrahydrofuran. The resulting solution was stirred at 65° C. for six hours in the presence of 0.64 g of 2,2-azobisisobutyronitrile (AIBN) under an inert atmosphere such as nitrogen or argon. Thereafter, a solid product was precipitated using ethyl ether and dried to afford the intermediate compound (12.8 g: Yield 40%).

In a 500 ml round-bottom flask was placed the intermediate compound along with 300 g of ethanol and 0.08 ml of trifluoromethanesulfonic acid. The reaction mixture was stirred at 85° C. for ten hours. Thereafter, the reaction mixture was neutralized to about pH 7 with tetramethylammonium hydroxide. The reaction mixture was concentrated and the residue was precipitated in water to afford compound of chemical formula 4.

EXAMPLE 3

Preparation of Anti-reflective Film Composition Using Compound of Chemical Formula 3 and Formation of Pattern Therefrom To 1,000 g of propyleneglycol methylether acetate was added 20.0 g of compound of chemical formula 3, 13.3 g of compound of chemical formula 5, and 0.33 g of a heat acid-generator of the chemical formula 7. The solution filtered through a 0.2 μm fine filter to give an organic anti-reflective film composition. This solution was spin-coated onto a silicon wafer and then cured by baking at 205° C. for 90 sec.

On the cured anti-reflective film was coated photosensitive agent DHA1001, and baked at 110° C. for 90 sec. Afterwards, the multi-coated wafer was exposed to an ArF light source with the aid of an ArF microstepper (manufactured by ISI) followed by another baking at 110° C. for 90 sec. The wafer was developed using an aqueous 2.38 wt % methylammonium hydroxide solution and observed to have well-defined perpendicular patterns as shown in FIG. 1.

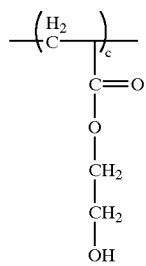

Formula 5

EXAMPLE 4

Preparation of Anti-reflective Film Composition Using Compound of Chemical Formula 3 and Formation of Pattern Therefrom To 1,000 g of propyleneglycol methylether acetate was added 20.0 g of compound of chemical formula 3, 13.3 g of compound of following chemical formula 6, and 0.33 g of heat acid-generator of chemical formula 7. The resulting solution was filtered through a 0.2 μm fine filter to give an organic anti-reflective film composition. This solution was spin-coated onto a silicon wafer and then cured by baking at 205° C. for 90 sec.

On the cured anti-reflective film was coated photosensitive agent DHA1001 and baked at 110° C. for 90 sec. Afterwards, the multi-coated wafer was exposed to light using an ArF light source with the aid of an ArF microstepper (manufactured by ISI) followed by baking at 110° C. for 90 sec. The wafer was developed using an aqueous 2.38 wt % methylammonium hydroxide solution and observed to have well-defined perpendicular patterns.

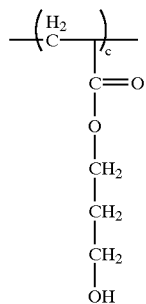

Formula 6

EXAMPLE 5

Preparation of Anti-reflective Film Composition Using Compound of Chemical Formula 4 and Formation of Pattern Therefrom To 1,000 g of propyleneglycol methylether acetate was added 20.0 g of compound of chemical formula 4, 13.3 g of compound of chemical formula 5, and 0.33 g of heat acid-generator of chemical formula 7. The resulting solution was filtered through a 0.2 μm fine filter to give an organic anti-reflective film composition. This solution was spin-coated onto a silicon wafer and then cured by baking at 205° C. for 90 sec.

On the cured anti-reflective film was coated the photosensitive agent DHA1001 and baked at 110° C. for 90 sec. Afterwards, the multi-coated wafer was exposed to light using an ArF light source with the aid of an ArF microstepper (manufactured by ISI) followed by baking at 110° C. for 90 sec. The wafer was developed using an aqueous 2.38 wt % methylammonium hydroxide solution and observed to have well-defined perpendicular patterns.

EXAMPLE 6

Preparation of Anti-reflective Film Composition Using Compound of Chemical Formula 4 and Formation of Pattern Therefrom To 1,000 g of propyleneglycol methylether acetate was dissolved 20.0 g of compound of chemical formula 4, 13.3 g of compound of chemical formula 6, and 0.33 g of heat acid-generator of chemical formula 7. The resulting solution was filtered through a 0.2 μm fine filter to give an organic anti-reflective film composition. This solution was spin-coated onto a silicon wafer and then cured by baking at 205° C. for 90 sec.

On the cured anti-reflective film was coated the photosensitive agent DHA1001 and baked at 110° C. for 90 sec. Afterwards, the multi-coated wafer was exposed light using an ArF light source with the aid of an ArF microstepper (manufactured by ISI) followed by baking at 110° C. for 90 sec. The wafer was developed using an aqueous 2.38 wt % methylammonium hydroxide solution and observed to have well-defined perpendicular patterns.

Anti-reflective compositions of the present invention which comprise a crosslinking agent of chemical formula 11 and an alcohol group-containing organic anti-reflective substrate of chemical formula 12 are not affected by a photoresist solution which overlays the anti-reflective film. That is, anti-reflective compositions of the present invention are not dissolved in a photoresist solution. Moreover, anti-reflective compositions of the present invention absorb the light penetrating through the photoresist film, thereby greatly reducing the standing wave effect. Thus, organic anti-reflective films of the present invention allow the patterns to be formed in a well-defined, ultrafine configuration, providing great contribution to a high integration of semiconductor devices.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A compound of chemical formula 11:

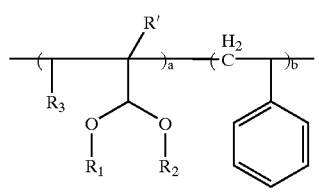

Formula 11 wherein
a and b represent mole numbers, respectively, meeting the condition that the ratio of a:b ranges from 0.1–1.0:0.1–1.0;
R' is hydrogen or alkyl;
$R_1$ and $R_2$, which are the same or different, each represents a substituted or unsubstituted, linear or branched alkyl group containing 1–5 carbon atoms; and
$R_3$ is a hydrogen atom or a substituted or unsubstituted, linear or branched alkyl containing 1–5 carbon atoms.

2. The compound according to claim 1 of the formulas 2 or 3:

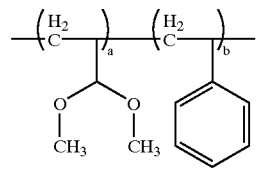

Formula 2

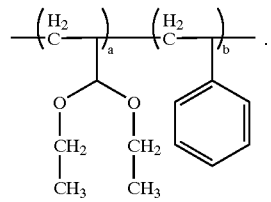

Formula 3

3. A method for preparing a compound of chemical formula 11

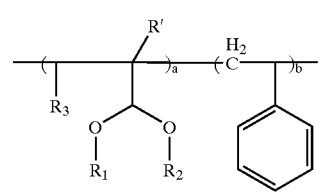

Formula 11 comprising the steps:
polymerizing monomers constituting the compound of said chemical formula 11 in an organic solvent in the presence of a polymerization initiator under conditions sufficient to produce said compound of formula 11.

4. The method as set forth in claim 3, wherein said solvent is selected from the group consisting of tetrahydrofuran, toluene, benzene, methylethyl ketone, dioxane and mixtures thereof.

5. The method as set forth in claim 3, wherein said polymerization initiator is selected from the group consisting of 2,2-azobisisobutyronitrile (AIBN), benzoylperoxide, acetylperoxide, laurylperoxide, t-butyloxide and mixtures thereof.

6. An organic anti-reflective film composition, comprising a compound represented by the chemical formula 11 and a compound represented by the following chemical formula 12:

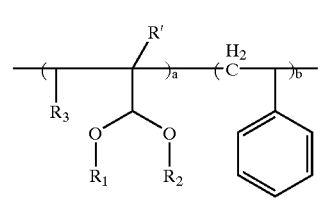

Formula 11

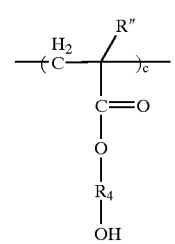

Formula 12 wherein c is 1;

R" is hydrogen or alkyl; and $R_4$ represents a substituted or unsubstituted, linear or branched alkyl group containing 1–5 carbon atoms.

7. The method as set forth in claim 6, wherein said compound of formula 12 is of the formulas 5 or 6:

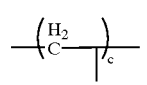

Formula 5

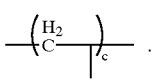

Formula 6

8. An organic anti-reflective film composition, comprising a compound of the chemical formula 11, a compound of the chemical formula 12, an organic solvent, and a heat acid-generator:

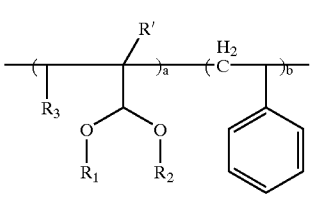

Formula 11

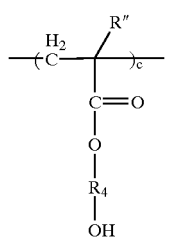

Formula 12 wherein c is 1;

R" is hydrogen or alkyl; and $R_4$ represents a substituted or unsubstituted, linear or branched alkyl group containing 1–5 carbon atoms.

9. The organic anti-reflective film composition as set forth in claim 8, wherein said organic solvent is selected from the group consisting of methyl 3-methoxypropionate, ethyl 3-ethoxypropionate, propyleneglycol methyletheracetate, 2-heptanone, tetrahydrofuran and mixtures thereof.

10. The organic anti-reflective film composition as set forth in claim 8, wherein said organic solvent is used in an amount of from about 2,000 to about 4,000% by weight based on the weight of compound of chemical formula 11 or 12.

11. The organic anti-reflective film composition as set forth in claim 8, wherein said heat acid-generator is selected from the group consisting of compounds of chemical formulas 7 to 10 and mixtures thereof:

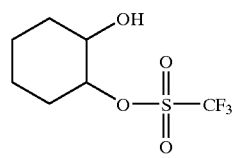

Formula 7

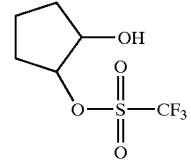

Formula 8

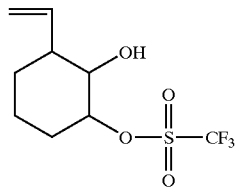

Formula 9

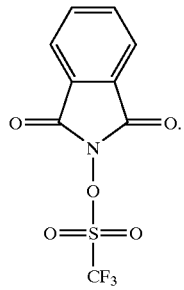

Formula 10

12. The organic anti-reflective film composition as set forth in claim 8, wherein said heat acid generator is used at an amount of from about 0.1 to about 10% by weight based on the total weight of compounds of chemical formulas 11 and 12.

13. A method for forming an anti-reflective film pattern using the organic anti-reflective film composition as in claim 8, comprising the steps of:

applying the organic anti-reflective film composition of claim 10 onto a layer to be etched;

baking the organic anti-reflective film composition-applied layer;

creating a photoresist pattern by coating a photoresist film on the organic anti-reflective film;

exposing the photoresist film to a light source;

developing the light-exposed photoresist film; and etching sequentially the organic anti-reflective film and further the layer to be etched with the photoresist pattern serving as an etch mask.

14. The method as set forth in claim 13, wherein the baking step is conducted at 100–250° C. for 1–5 min.

15. The method as set forth in claim 13, further comprising a baking step prior to and/or subsequent to the exposing step.

16. The method as set forth in claim 14, wherein the baking step is conducted at 70–200° C.

17. The method as set forth in claim 13, wherein said exposing step is conducted using a light source selected from the group consisting of deep ultra violet beams including ArF, KrF and EUV, an electron beam, an X-ray, an ion beam, and combinations thereof.

18. The method as set forth in claim 13, wherein said exposing step is carried out under the light source with energy of 0.1–20 $mJ/cm^2$.

* * * * *